United States Patent [19]

Erb

[11] Patent Number: 4,707,457

[45] Date of Patent: Nov. 17, 1987

[54] METHOD FOR MAKING IMPROVED CONTACT FOR INTEGRATED CIRCUIT STRUCTURE

[75] Inventor: Darrell M. Erb, Los Altos, Calif.

[73] Assignee: Advanced Micro Devices, Inc., Sunnyvale, Calif.

[21] Appl. No.: 647,796

[22] Filed: Apr. 3, 1986

[51] Int. Cl.[4] ............................................. H01L 21/76
[52] U.S. Cl. ..................................... 437/193; 437/52; 437/195; 437/194; 357/23.6
[58] Field of Search .................. 156/643; 29/589, 571, 29/591, 590, 577 C; 148/DIG. 20, DIG. 43

[56] References Cited

U.S. PATENT DOCUMENTS

| | | | |
|---|---|---|---|
| 4,075,756 | 2/1978 | Kircher et al. | 29/625 |
| 4,324,038 | 4/1982 | Chang et al. | 29/571 |
| 4,397,077 | 8/1983 | Derbenwick et al. | 357/6 |
| 4,414,058 | 11/1983 | Mueller | 357/23.6 |
| 4,419,810 | 12/1983 | Riseman | 29/571 |
| 4,455,194 | 6/1984 | Yabu et al. | 29/578 |
| 4,489,481 | 12/1984 | Jones | 29/591 |
| 4,507,853 | 4/1985 | McDavid | 29/591 |
| 4,586,968 | 5/1986 | Coello-Vera | 29/591 |
| 4,630,357 | 12/1986 | Rogers et al. | 29/571 |
| 4,641,420 | 2/1987 | Lee | 29/591 |
| 4,652,898 | 3/1987 | Lange et al. | 357/23.6 |

FOREIGN PATENT DOCUMENTS 0036500 9/1981 European Pat. Off.
72321 5/1982 Japan.

OTHER PUBLICATIONS

"A Half Micron MOSFET Using Double Implanted LDD", Seiki Ogura, *IEDM Tehnical Digest*, International Electron Device Meeting, 1982, pp. 718–721.

Primary Examiner—Brian E. Hearn
Assistant Examiner—Beverly A. Pawlikowski
Attorney, Agent, or Firm—Patrick T. King; John P. Taylor

[57] ABSTRACT

An improved contact construction for an integrated circuit structure having closely spaced electrodes adjacent the contact is disclosed. The integrated circuit structure having the improved contact comprises a substrate having an insulating layer thereon, a first conductive layer over the insulating layer, and a second insulating layer formed over the first conductive layer. A self-aligned contact opening is formed through the second insulating layer, the underlying first conductive layer, and the first insulating layer to expose the substrate. A layer of insulating material is then formed on the sidewalls of the opening to cover the exposed edges of the first conductive layer. Conductive material is then placed in the self-aligned contact opening and a second conductive layer is formed over the second insulating layer whereby the conductive material placed in the self-aligned contact opening electrically connects the substrate with the second conducting layer.

7 Claims, 44 Drawing Figures

METHOD FOR MAKING IMPROVED CONTACT FOR INTEGRATED CIRCUIT STRUCTURE

BACKGROUND OF THE INVENTION

1. Field of the Invention

This invention relates to an improved contact for an integrated circuit structure. More particularly, this invention relates to an improved contact to an electrode such as a bit line adjacent another electrode such as a word line in an integrated circuit structure and a method of making the improved contact.

2. Description of the Related Art

In the conventional construction of integrated circuit structures such as, for example, a dynamic RAM memory cell (DRAM), contact to the bit line had to be separated from the adjacent word line comprising the gate of the memory transistor by a certain distance dictated both by minimum insulation requirements and alignment tolerances. Because of the misalignment possibilities and the deleterious effects of same, alignment tolerance considerations have usually exceeded insulation requirements as far as area used for the contact.

As shown in the prior art structure of FIGS. 1 and 2, conventional construction of contact A between metal bit line B and the source or drain C of the respective memory transistor in D substrate usually required a minimum spacing shown as S between contact A and the adjoining word lines E comprising the gates of the memory transistors. This minimum space S, which was required on all sides of contact A as shown in FIG. 2, was usually about one micron.

In the production of VSLI structures containing thousands of such memory cells, this additional spacing requirement is multiplied many times in terms of the total area needed. Reduction of the space required for each bit line contact without compromising the integrity of the design would therefore be highly desirable.

SUMMARY OF THE INVENTION

It is therefore an object of this invention to provide an improved contact to an integrated circuit structure which will occupy less space than conventional contacts.

It is another object of this invention to provide an improved bit line contact to a memory cell which will occupy less space than conventional contacts of this type.

It is yet another object of this invention to provide a method of making such an improved contact.

These and other objects of the invention will be apparent from the following description and accompanying drawings.

In accordance with the invention an improved contact for an integrated circuit structure such as a bit line contact for a memory cell comprises a substrate having an insulating layer thereon and a first conductive layer over the insulating layer. A second insulating layer is formed over the first conductive layer and a self-aligned contact opening is formed through the second insulating layer, the underlying first conductive layer, and first insulating layer to expose the substrate. A layer of insulating material is then formed on the sidewalls of the opening to cover the exposed edges of the first conductive layer. Conductive material is then placed in the opening and a second conductive layer is formed over the second insulating layer whereby the conductive material placed in said self-aligned contact opening electrically connects the substrate with the second conducting layer.

DESCRIPTION OF THE PREFERRED EMBODIMENTS

Figure 3:
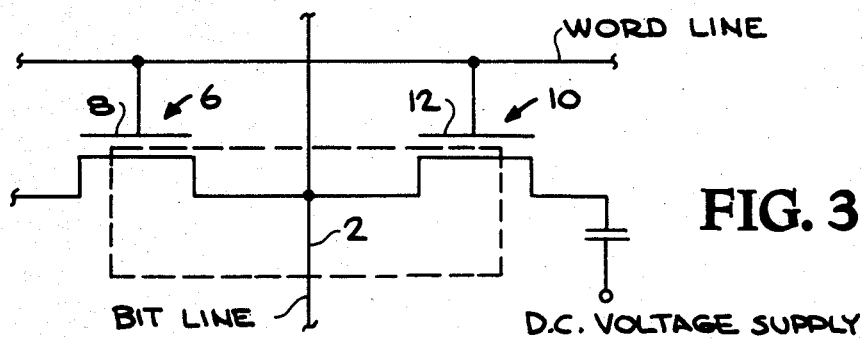
FIG. 3 is an electrical schematic of a typical DRAM memory cell to which the invention may be applied.

FIG. 3 illustrates in schematic form a typical memory cell in which the present invention finds utility. As shown in the schematic, a bit line 2 is connected to the source or drain of two adjacent memory transistors 6 and 10 in adjacent memory cells. The respective gate electrodes 8 and 12 of transistors 6 and 10 comprise word lines which must be spaced from bit line 2. The invention provides the necessary spacing while minimizing the area used in forming the contact.

Figure 4:
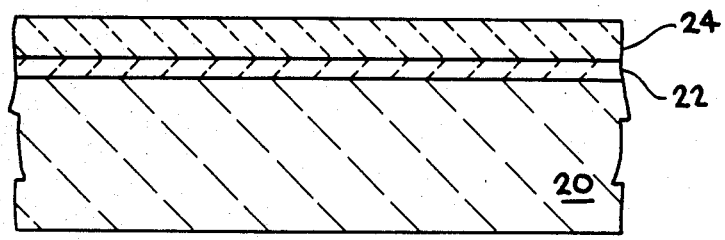
FIGS. 4–6 are fragmentary vertical side views in cross-section of initial steps in the construction of one embodiment of the contact of the invention.

Turning now to FIGS. 4-16, construction of one embodiment of the invention will be described. As shown in FIG. 4, a silicon substrate 20 is illustrated which may represent underlying aspects of the integrated circuit structure or the basic substrate itself. A gate oxide layer 22 is first formed over substrate 20 and then a layer of polysilicon 24 is formed over gate oxide layer 22. After deposition of polysilicon layer 24, and preferably before masking, the polysilicon is appropriately doped, e.g., with phosphorus, to provide the desired degree of conductivity in the word lines and transistor gates to be formed therefrom.

Figure 5:
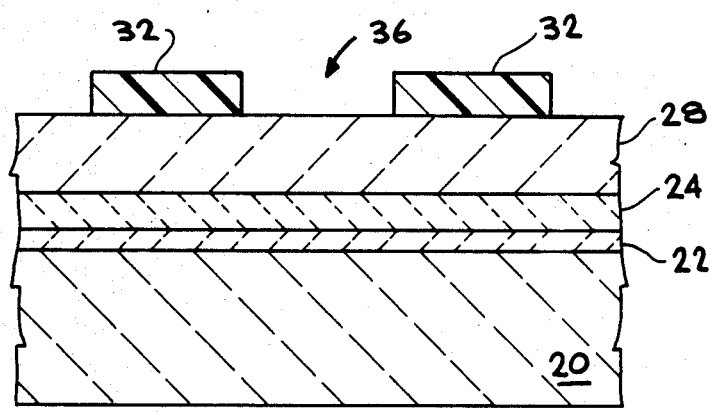

An oxide layer 28 is then formed over the structure and planarized to a thickness of about 0.6 micron as illustrated in FIG. 5. A photoresist mask 32 is then formed over oxide layer 28 with a contact opening 36 therein to at least partially define a self-aligned contact through oxide layer 28 and polysilicon layer 24 to substrate 20 and to define the transistor gates and interconnect elements from polysilicon layer 24.

Oxide layer 28 is etched through opening 36 in photoresist mask 32 using an appropriate etching system such as reactive ion etching (RIE) with CHF$_3$ gas. The portion of polysilicon layer 24 exposed by etching oxide layer 28 is then etched by RIE etching with CCl$_4$ gas to form the opening 42 shown in FIG. 6 as well as the gates and interconnect elements as previously discussed.

Figure 6:
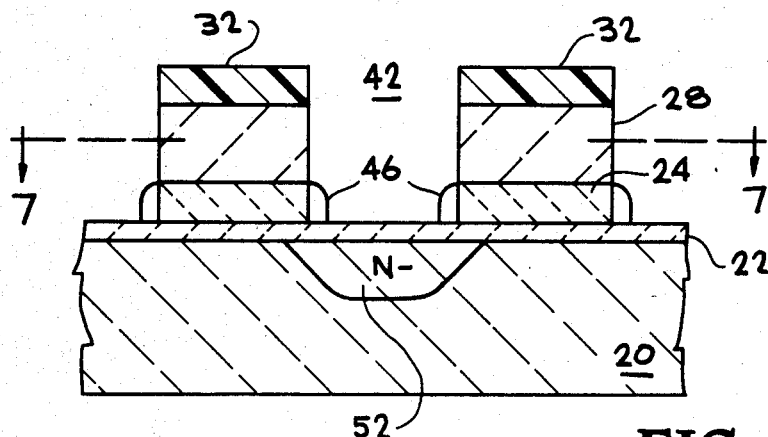
Figure 7:
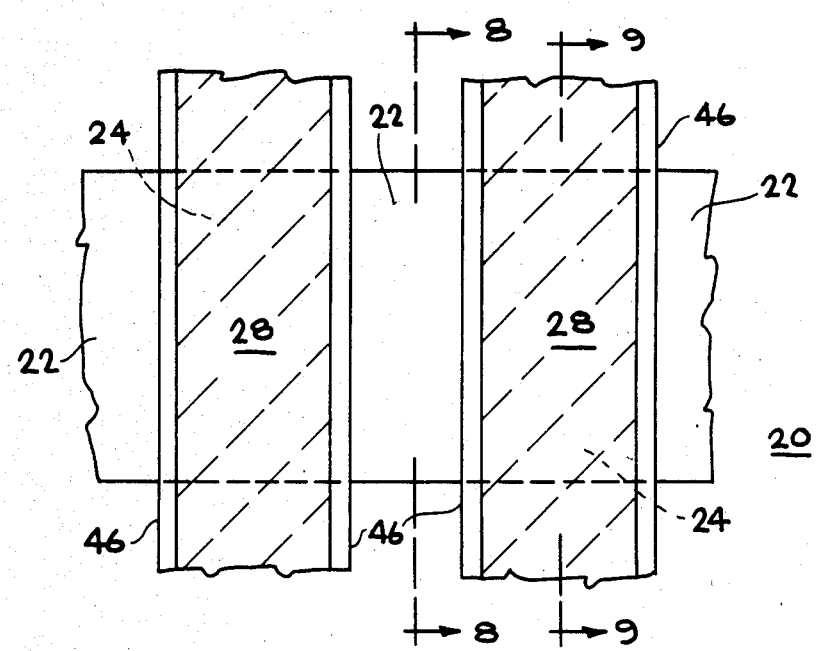
FIG. 7 is a fragmentary top view of the structure of FIG. 6 taken along lines 7—7.
Figure 8:
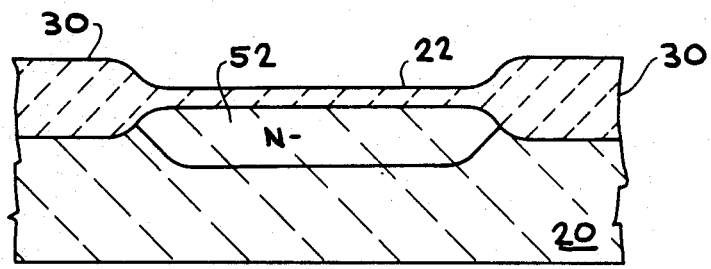
FIG. 8 is a fragmentary vertical end view in cross-section of the structure of FIG. 7 taken along lines 8—8.
Figure 9:
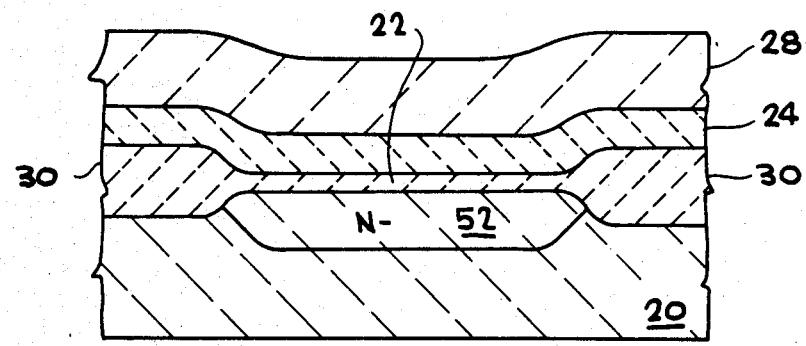
FIG. 9 is a fragmentary vertical end view in cross-section of the structure of FIG. 7 taken along lines 9—9.

After forming opening 42, the exposed edges of polysilicon layer 24 are oxidized to form protective oxide portions 46 as shown in FIGS. 6 and 7. The exposed silicon substrate is then lightly doped to form a lightly doped drain (LDD) region 52 which, in the illustrated embodiment of FIGS. 6, 8, and 9, is shown as an N— region of about 0.3 microns depth formed by phosphorus implantation.

Figure 10:
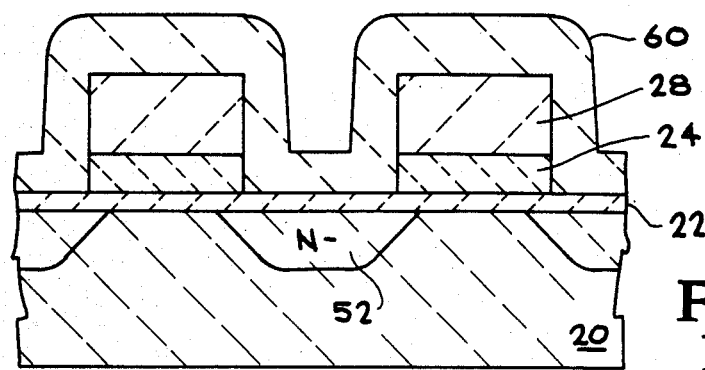
FIGS. 10–11 are fragmentary vertical side views in cross-section illustrating subsequent steps in the construction of one embodiment of the improved contact of the invention.

A further conformal oxide layer 60 is now formed over the structure to a thickness of about 2000-3000 Angstroms as shown in FIG. 10. The structure is now masked with self-aligned contact (SAC) mask 66, which may comprise a photoresist with a contact opening 68, as shown in FIGS. 11 and 12, and then anisotropically etched using, for example, a reactive ion etch (RIE) to etch back oxide layer 60 and to open the contact to the LDD region 52 of substrate 20.

It will be noted that oxide portions 46 shown in FIGS. 6 and 7 have been illustrated for convenience in subsequent figures as a part of oxide layer 60 and that oxide layer 28 and oxide layer 60 are illustrated for convenience as oxide layer 60. It should be further noted here that at least part of the purpose for providing oxide layer 28 of about 0.6 micron thickness (which is subsequently beneath oxide layer 60) is to insure that the anisotropic etching of oxide layer 60 does not result in complete removal of the protective oxide (now referred to as oxide 60) except in the desired contact region.

Figure 11:
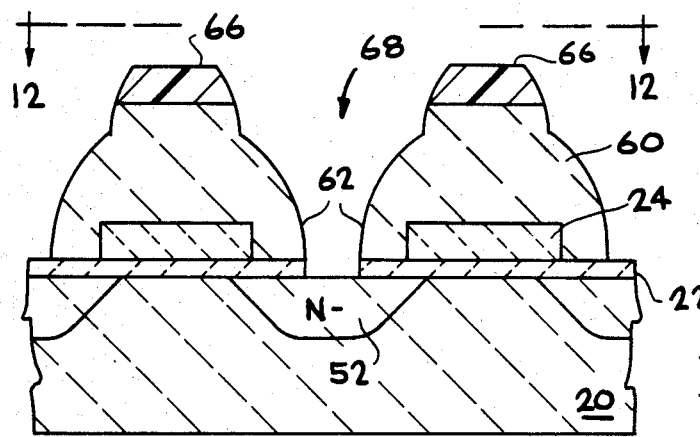
Figure 12:
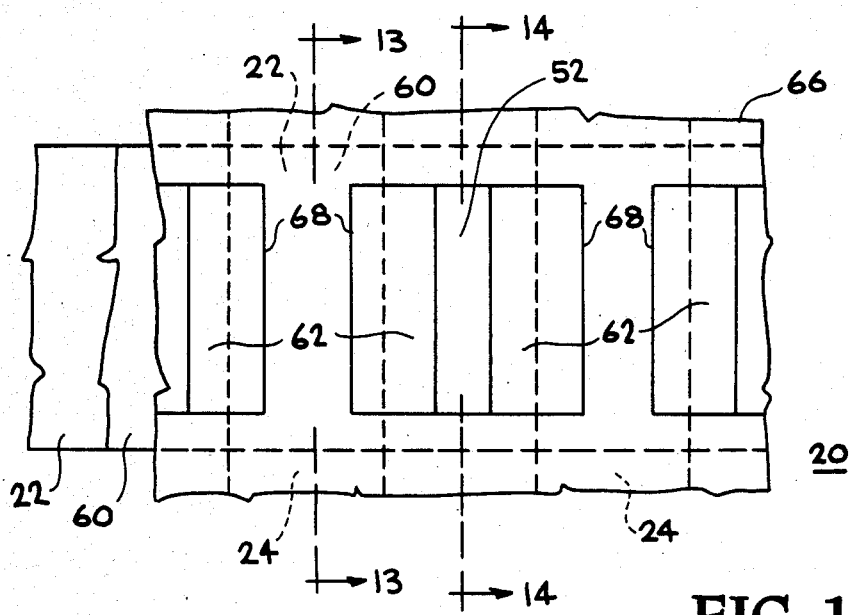
FIG. 12 is a fragmentary top view of the structure of FIG. 11 taken along lines 12—12.
Figure 13:
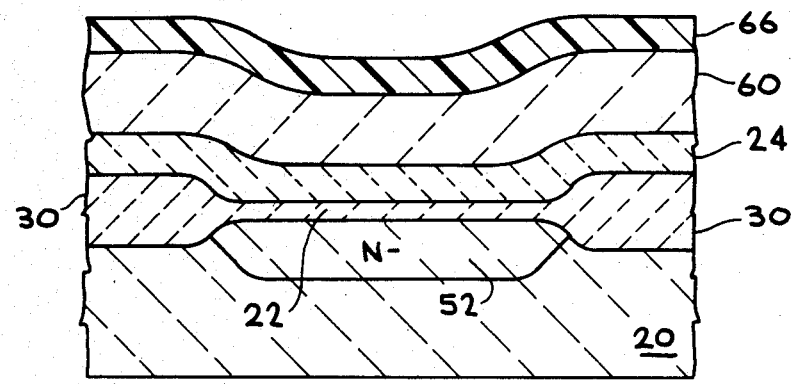
FIG. 13 is a fragmentary end view in cross-section of the structure of FIG. 12 taken along lines 13—13.
Figure 14:
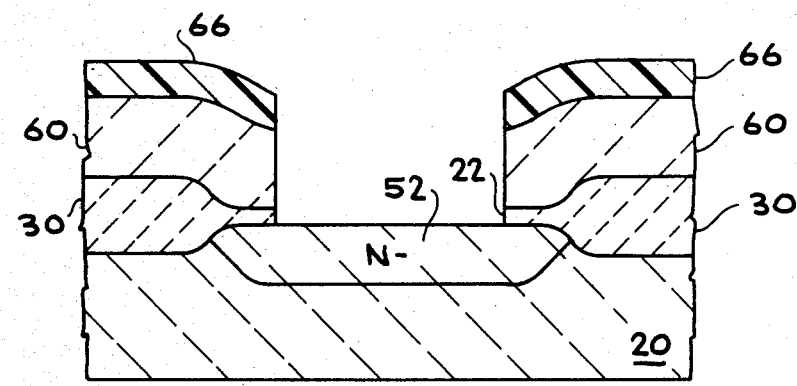
FIG. 14 is a fragmentary end view in cross-section of the structure of FIG. 12 taken along lines 14—14.

The result of the anisotropic etching of layer 60 to open the contact to substrate 20, as shown in FIGS. 11 and 14, is to preserve the protective oxide adjacent the edges of polysilicon 24 as strips 62. Oxide strips 62 will ultimately provide the required insulation between the word lines comprising polysilicon 24 and the bit line contact to be formed.

Figure 15:
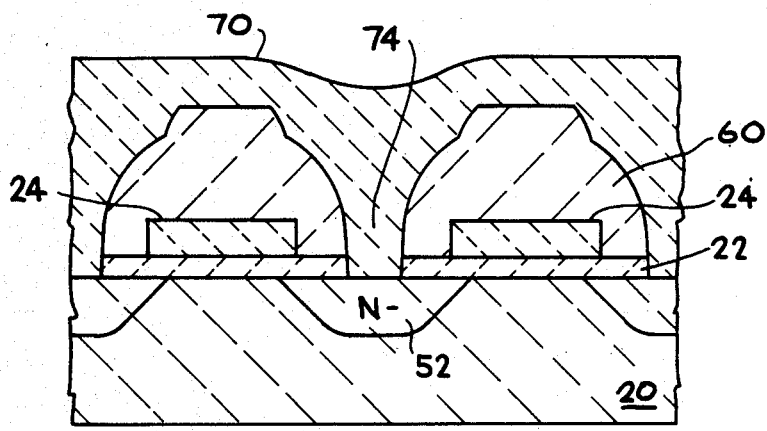
FIGS. 15 and 16 are vertical side views in cross-section of the final stages in the construction of the structure of the invention.

After opening the contact to substrate 20 and formation of the oxide strips 62, mask 66 is removed and a further layer of polysilicon 70 or other suitable conductor material is deposited to fill up the opening between the oxide strips 62 down to the interface with LDD region 52 as shown in FIG. 15. Polysilicon layer 70 may then be N+ doped with arsenic or phosphorus which diffuses into LDD region 52 to form the low resistance contact 54 as shown in FIG. 16.

Polysilicon layer 70 is then masked to form polysilicon contact 74 having winged portions 76. A further oxide layer 80 (shown merged with oxide layer 60 in FIG. 16) may then be formed over polysilicon contact 74. A via 86 may then be cut through oxide layer 80 and filled with metal, e.g., aluminum, to provide metal contact 90 which communicates with polysilicon contact 74 to form a bit line contact between the source/drain region 52 and a bit line 92 which may then be formed over bit line contact 90.

Figure 16:
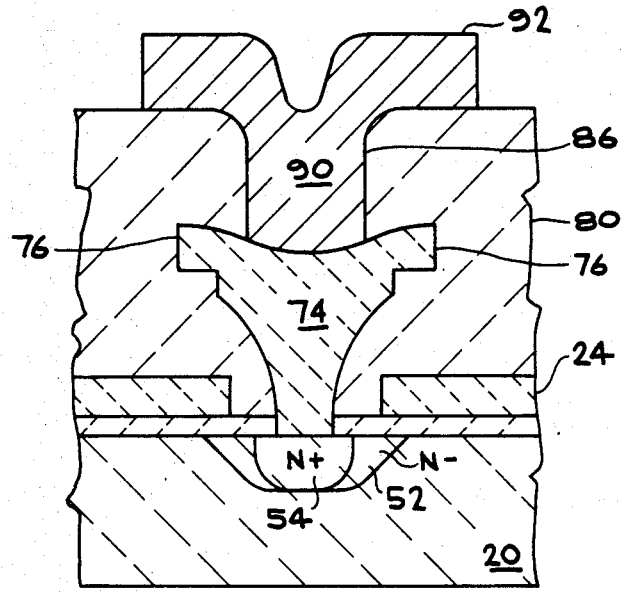

The bit line may now be formed as shown at 92 in FIG. 16. Bit line 92 may comprise a metal strip or a layer of doped polysilicon, particularly if further layers will be applied over the resulting bit line 92 and bit line contact 90. Alternatively, polysilicon layer 70 may be defined as an interconnect to other portions of the integrated circuit structure without forming a metal contact or strip electrode thereon.

Figure 1:
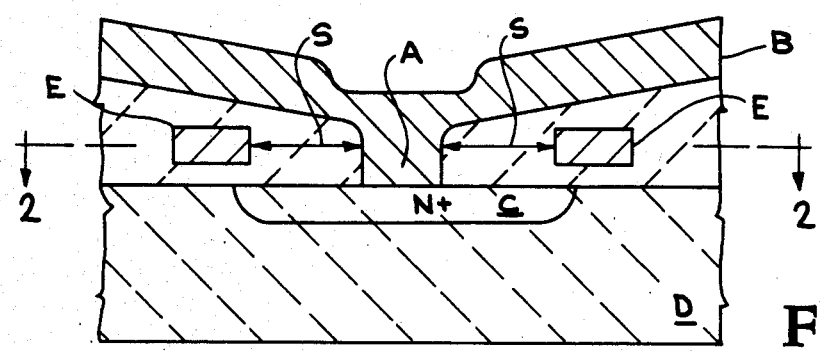
FIG. 1 is a fragmentary vertical side view in cross-section showing the relationship of a prior art bit line contact to adjacent word lines.
Figure 2:
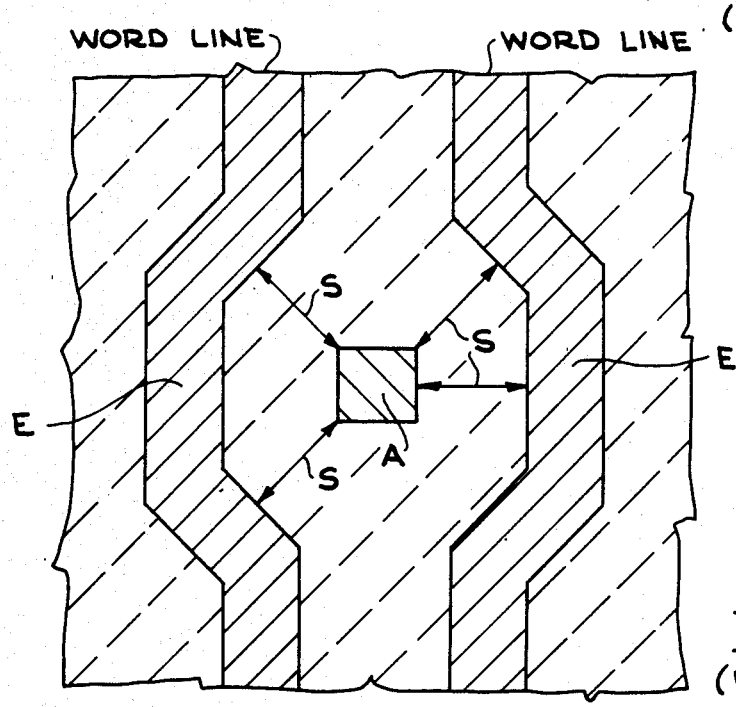
FIG. 2 is a fragmentary top view of the prior art bit line contact and the spacing between the contact and the adjacent word lines shown in FIG. 1 along lines 2—2.

From examination of FIG. 16 and comparison to the prior art structure illustrated in FIGS. 1 and 2, it will be readily apparent that the formation of the bit line contact of the invention using the self-alignment techniques described together with formation of the insulative oxide portions 62 and the winged portions 76 (which compensate for less than precise alignment of via 86 with polysilicon contact 74) permits the polysilicon word line/gates 24 to be spaced much closer to bit line polysilicon contact 74 thus occupying much less area than the prior art structure.

Figure 17:
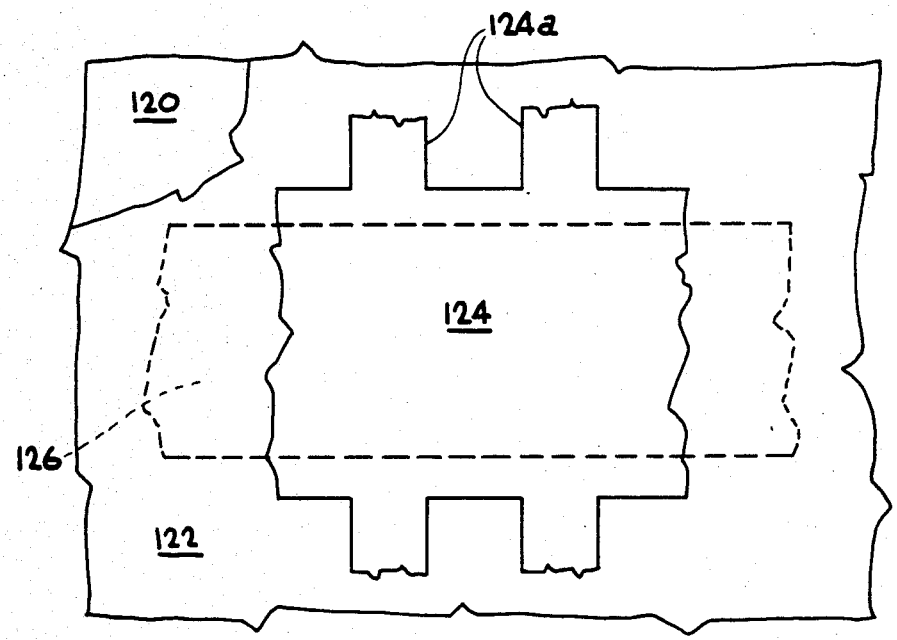
FIG. 17 is a fragmentary top view of a first stage of the construction of a second embodiment of the invention.

Turning now to FIGS. 17 to 35, a second embodiment of the invention is illustrated which may be used in forming contacts to other types of integrated circuit devices. In this embodiment, a gate oxide 122 and a polysilicon layer 124 are formed over substrate 120, including active transistor portion 126 of substrate 120, and then partially patterned to form strips over the non-active portion of substrate 120 as shown at 124a in FIG. 17.

Figure 18:
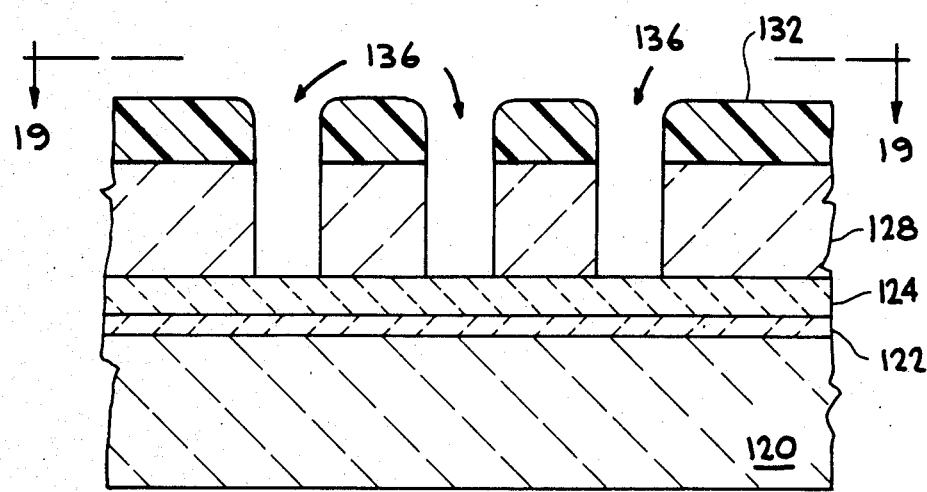
FIG. 18 is a fragmentary vertical view in side-section of another step in constructing the second embodiment of the invention.

An oxide layer 128, which has been smoothed to eliminate sharp steps using planarization processes such as described in and claimed in Thomas and Koyama U.S. Pat. No. 4,481,070, is formed over patterned polysilicon strip 124. A self-aligned contact (SAC) mask, which may comprise a photoresist layer 132 with openings 136 therein, is then formed over oxide layer 128 as shown in FIGS. 18 and 19.

Oxide layer 128 is then etched through openings 136 in mask 132, using, for example, an RIE with $CHF_3$ as previously described, and the resulting exposed portions of underlying polysilicon strip 124 are then also etched as in the previous embodiment.

Figure 19:
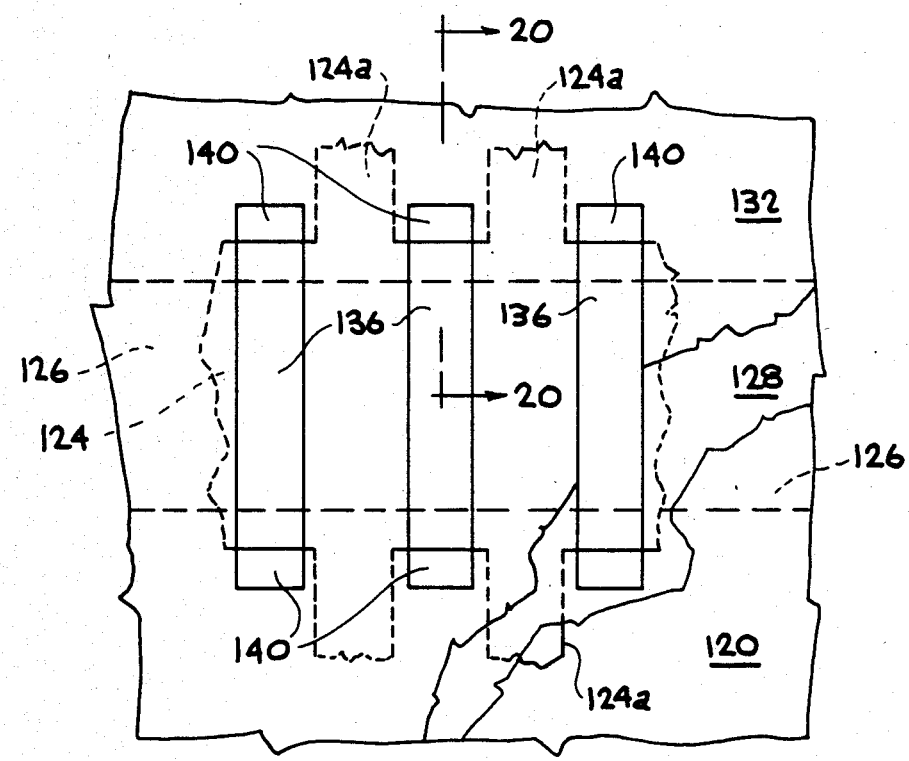
FIG. 19 is a fragmentary top view of the structure of FIG. 18 with a portion of the structure peeled away to show lower layers.

However, it will be noted in this embodiment that, due to the previous patterning of polysilicon layer 124a, imprecise alignment of the openings 136 in mask 132 can result in an overlap as shown at 140 in FIG. 19 wherein silicon substrate 120 rather than polysilicon strip 124 is exposed by the preliminary etching of oxide layer 128. It should be noted that overlap regions 140 are intentionally designed into the structure to allow or compensate for imprecise alignment and to insure that the gate electrodes are separated. Subsequent etching of polysilicon 124a and doping of the underlying substrate 120 will result in the formation of an undesired junction in substrate 120 at 140.

Figure 20:
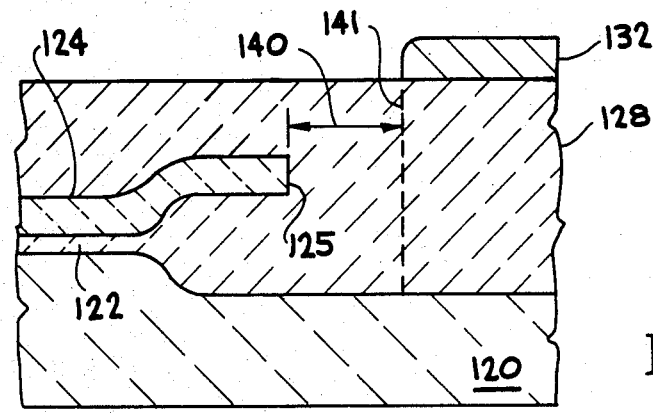
FIG. 20 is a fragmentary vertical end view in cross-section of the structure of FIG. 19 taken along lines 20—20.
Figure 21:
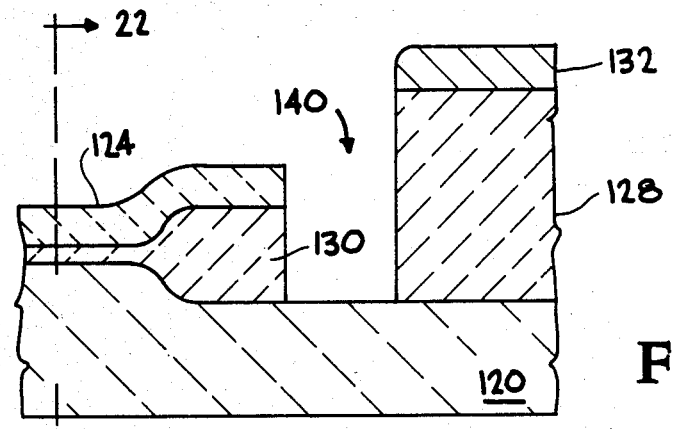
FIG. 21 is a fragmentary vertical end view in cross-section of a further stage in the construction of the second embodiment of the invention.
Figure 22:
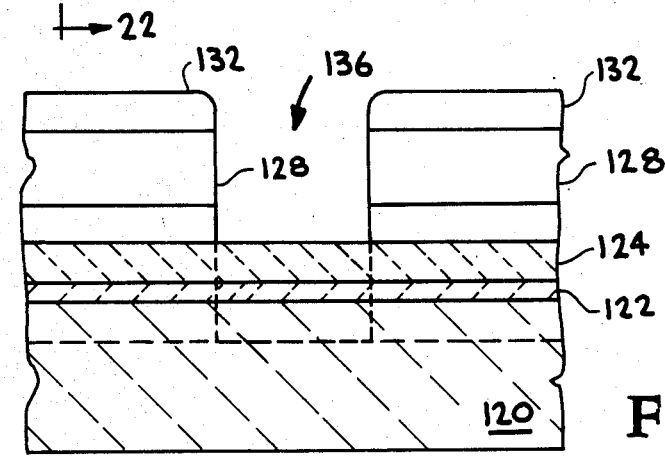
FIG. 22 is a fragmentary vertical side view in cross-section of the structure illustrated in FIG. 21 along lines 22—22.

This is illustrated in the sequential steps of FIGS. 20-32 wherein side section and end section views of each step are sequentially shown. In FIG. 20, dotted line 141 illustrates the projection of mask 132 into oxide layer 128 wherein the distance or space 140 between dotted line 141 and the end 125 of polysilicon strip 124 represents the amount by which mask 132 is overlapped with the underlying portion of polysilicon strip 124. Etching of oxide layer 128 through opening 136 in mask 132 in FIG. 22 also then results in the removal of oxide layer 128 at 140 in FIG. 21.

Figure 23:
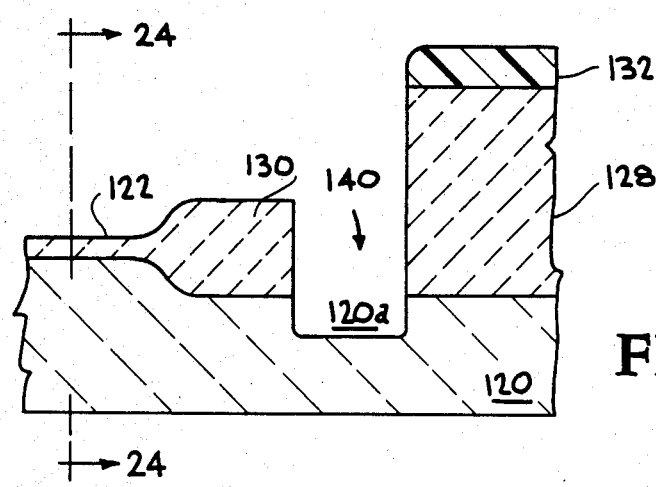
FIG. 23 is a fragmentary vertical end view in cross-section of a further stage in the construction of the second embodiment of the invention.
Figure 24:
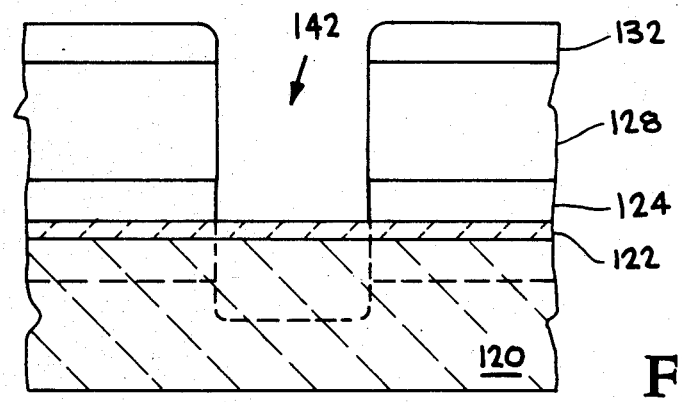
FIG. 24 is a fragmentary vertical side view in cross-section of the structure illustrated in FIG. 23 along lines 24—24.
Figure 25:
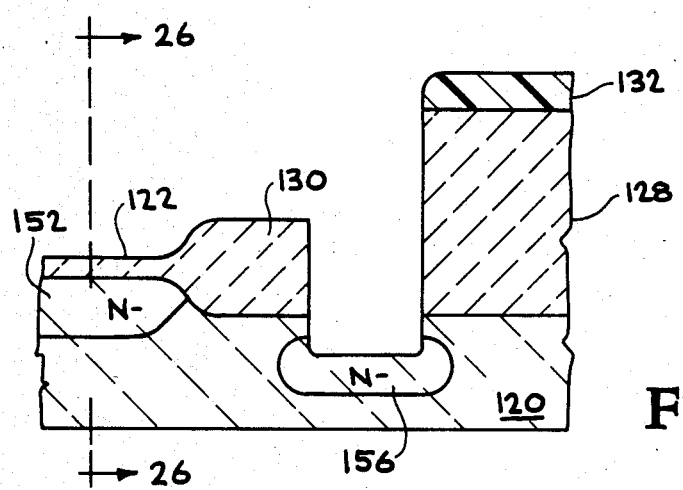
FIG. 25 is a fragmentary vertical end view in cross-section of a further stage in the construction of the second embodiment of the invention.
Figure 26:
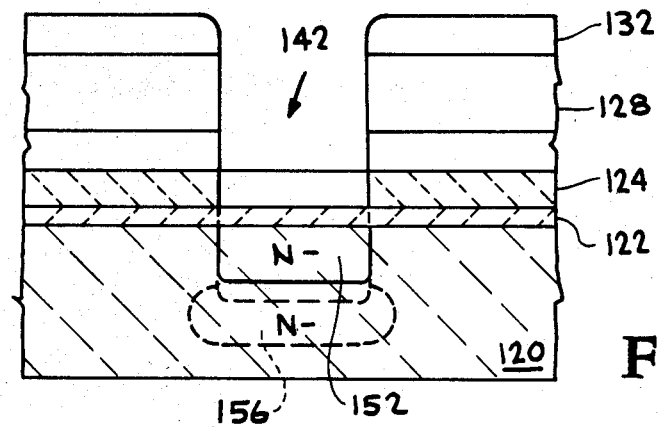
FIG. 26 is a fragmentary vertical side view in cross-section of the structure illustrated in FIG. 25 along lines 26—26.

Subsequent etching of the exposed portion of polysilicon strip 124 in FIG. 24 also results in the etching away of portion 120a of silicon substrate 120 in FIG. 23. When substrate 120 is then doped at 152 to form the lightly doped drain (LDD) region 152, in the contact area of substrate 120 beneath the opened contact 142, as shown in FIG. 26, substrate 120 is also doped at 156 as shown in FIG. 25.

Figure 27:
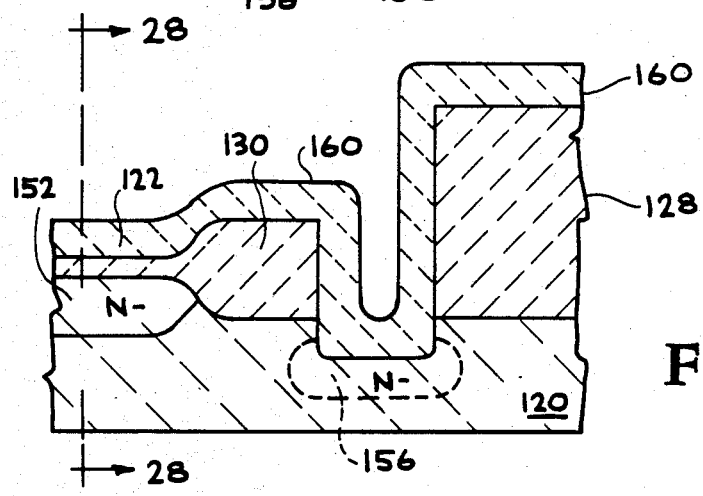
FIG. 27 is a fragmentary vertical end view in cross-section of a further stage in the construction of the second embodiment of the invention.
Figure 28:
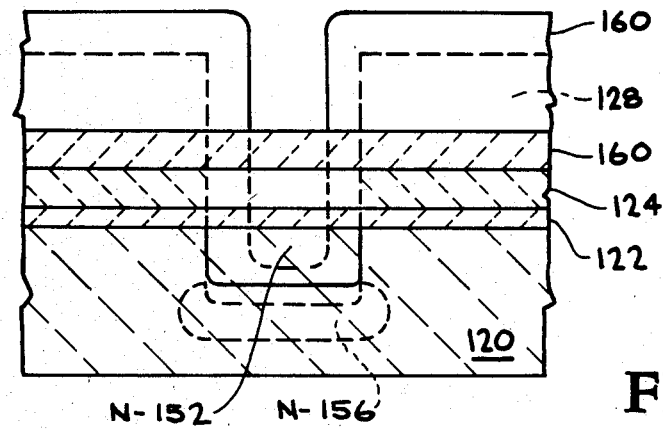
FIG. 28 is a fragmentary vertical side view in cross-section of the structure illustrated in FIG. 27 along lines 28—28.
Figure 29:
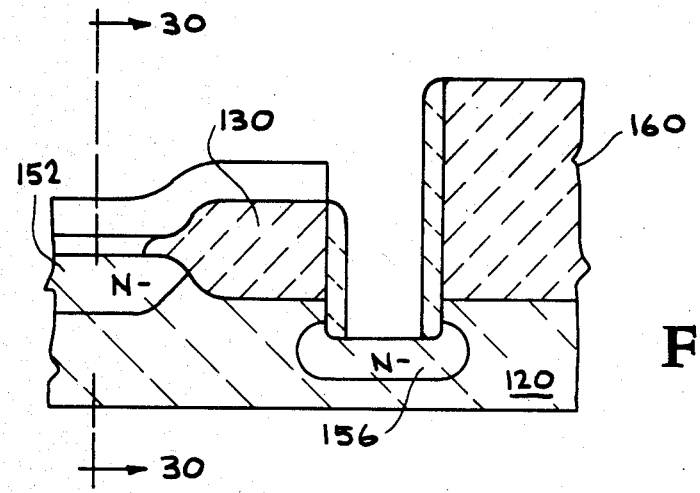
FIG. 29 is a fragmentary vertical end view in cross-section of a further stage in the construction of the second embodiment of the invention.
Figure 30:
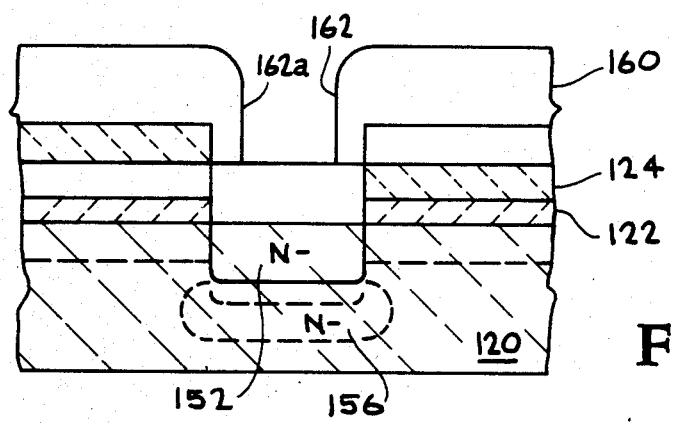
FIG. 30 is a fragmentary vertical side view in cross-section of the structure illustrated in FIG. 29 along lines 30—30.

A conformal oxide layer 160 is then deposited, as shown in FIGS. 27 and 28. Oxide layer 160 is anisotropically etched, as shown in FIGS. 29 and 30, to open the contact to substrate 120 by removing portions of oxide 160 leaving oxide portions 162 and 162a on the exposed sides of polysilicon strip 124. The etched area is then refilled with polysilicon by depositing a layer of polysilicon which is then etched back, using an anisotropic etch that removes polysilicon from the planarized oxide layer 128 but leaves polysilicon in crevices (created at 136 in FIG. 19) as shown in FIGS. 31 and 32 to form a polysilicon plug or via 170.

Figure 33:
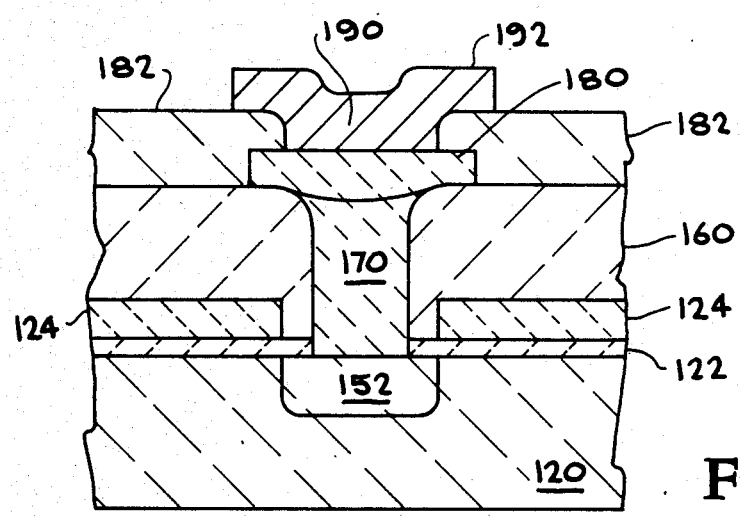
FIG. 33 is a fragmentary vertical side view in cross-section of the completed contact of the second embodiment of the invention.

As shown in FIG. 33, a further doped layer of polysilicon may then be applied over the structure and patterned leaving a polysilicon strip 180 in contact with plug 170. After formation of a further oxide layer 182 over polysilicon strip 180, a metal layer, e.g., aluminum, is applied and patterned to form metal line 192 which is electrically connected to polysilicon strip 180 by metal contact or via 190.

The wide dimension of strip 180, in similar fashion to the polysilicon wings 76 of the first embodiment, permits ease of interconnection between polysilicon strip 180 and metal line 192 by via 190 without the need for precise alignment.

Figure 31:
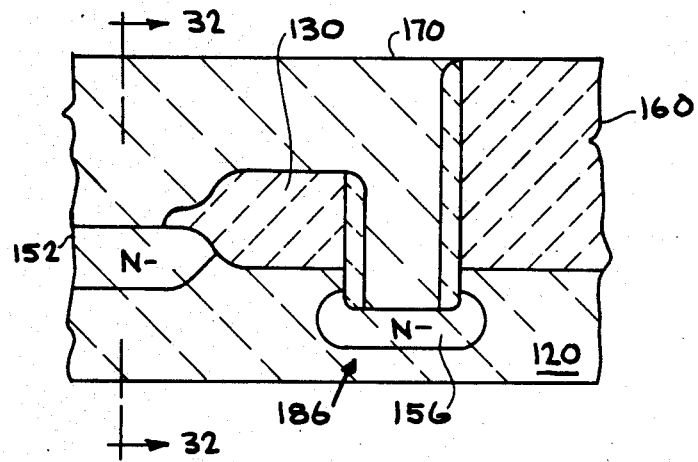
FIG. 31 is a fragmentary vertical end view in cross-section of a further stage in the construction of the second embodiment of the invention.
Figure 32:
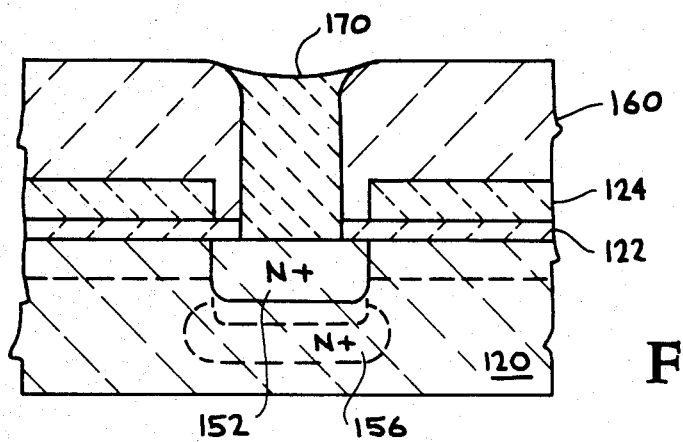
FIG. 32 is a fragmentary vertical side view in cross-section of the structure illustrated in FIG. 31 along lines 32—32.

However, the steps illustrated in FIGS. 20-32, at the same time, create an undesired junction 186 adjacent N— region 156 which is formed in substrate 120 beneath region 140 beyond the end of polysilicon strip 124 as best seen in FIG. 31. This formation can be traced through the sucessive end views shown in FIGS. 20-21, 23, 25, 27, 29, and 31.

Figure 34:
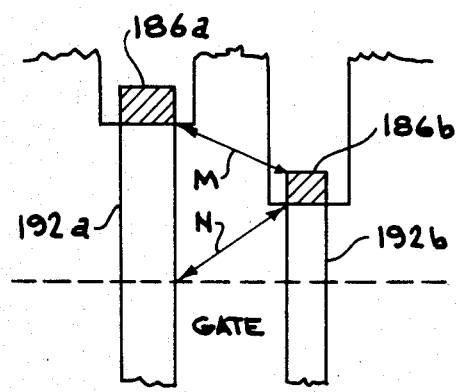
FIG. 34 is a fragmentary top view of a variation of the second embodiment of the invention.
Figure 35:
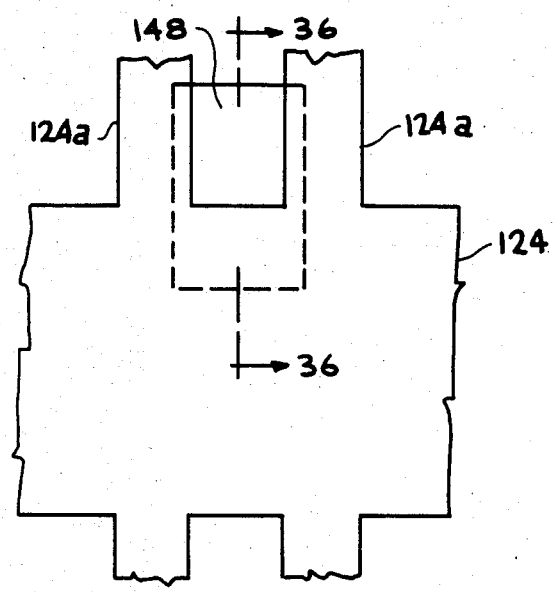
FIG. 35 is a fragmentary top view of a first step of a second variation in constructing the second embodiment of the invention.
Figure 36:
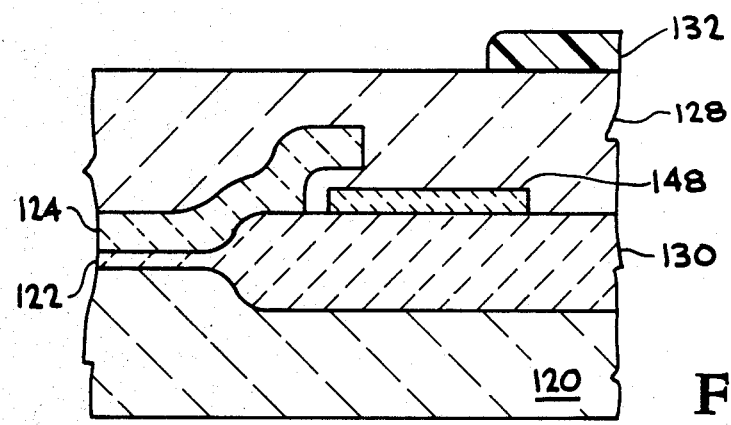
FIGS. 36 to 38 are fragmentary vertical end views in cross-section showing subsequent steps in constructing the second variation of the second embodiment of the invention.
Figure 37:
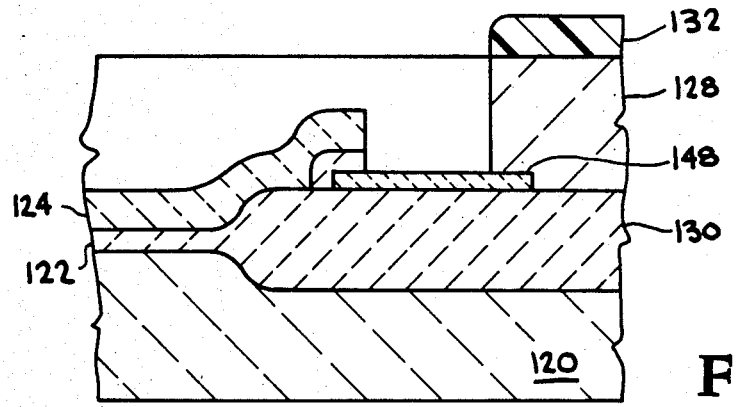

FIG. 34 illustrates one solution to the problem of the undesired junction illustrated in FIG. 31. In this variation of the second embodiment, the undesired junctions 186 respectively associated with contacts on adjacent conductors or lines, for example, are staggered to provide a sufficient distance M between junctions 186a and 186b and a distance N between the undesired junction and the edge of the active transistor area so that the respective depletion regions formed adjacent the junctions will not overlap and no undesirable current leakage will occur.

Figure 38:
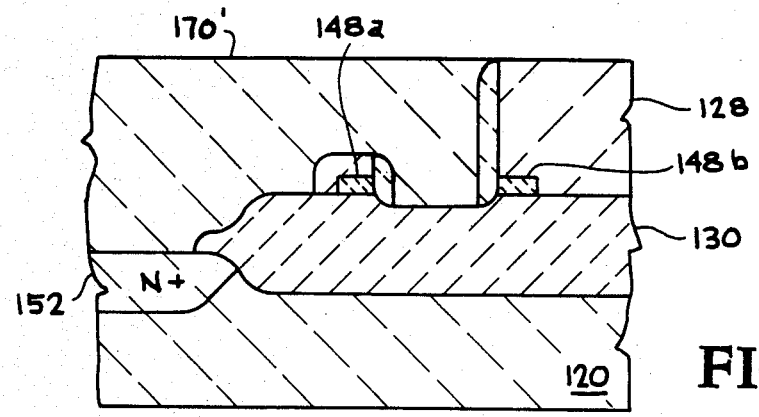

In another variation of the the second embodiment, addressed to the problem of formation of undesired junctions, another layer or strip of polysilicon 148 may be provided adjacent polysilicon strip 124a, as shown in FIGS. 35-38 by providing a patterned layer of polysilicon over field oxide 130 prior to formation of oxide layer 128. When oxide layer 128 is etched down to the polysilicon/silicon, the second polysilicon layer or strip 148 will act as an etch block instead of silicon substrate 120. As shown in FIG. 38, subsequent etching of the exposed portion of polysilicon strip 148 to the underlying field oxide 130, doping, and refilling with polysilicon will not result in formation of the undesired junction in substrate 120 because of field oxide 130 beneath polysilicon strip 148.

Turning now to FIGS. 39A-B and 40A-C, a plurality of contacts, respectively formed in accordance with either the first embodiment (FIGS. 39A and 39B) or the second embodiment (FIGS. 40A, 40B, and 40C), are illustrated to show the close spacing between adjacent transistor gates and source-drain contacts, or other transistor electrodes, which can now be achieved using the contact structure of the invention.

Figure 39A:
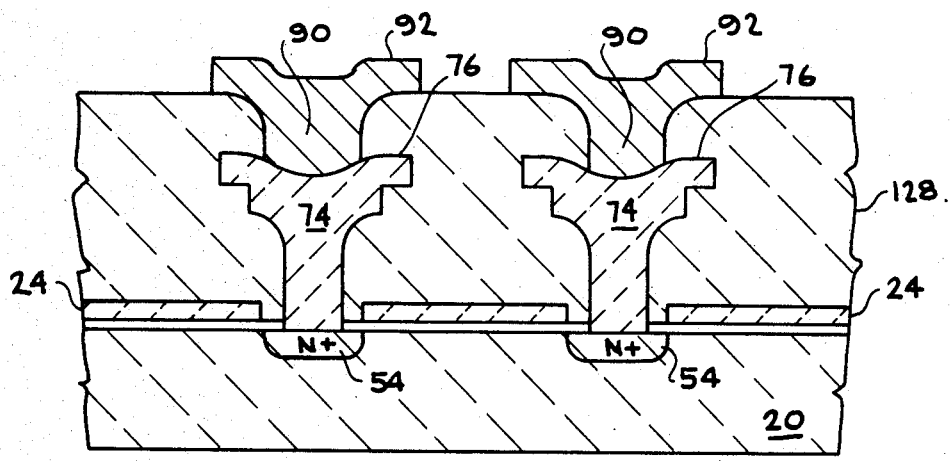
FIGS. 39A-39B are vertical side views in cross-section showing the spacing between contacts utilizing the second embodiment of the invention.

FIG. 39A illustrates an integrated circuit structure wherein two parallel interconnect lines 92 are formed with respective side by side contacts to the N+ regions 54 in substrate 20 formed in between transistor gates 24.

Figure 39B:
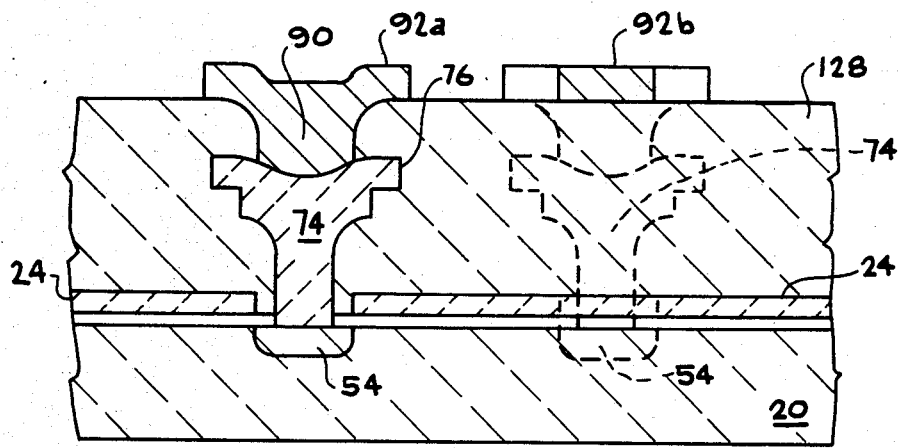

In contrast, in FIG. 39B, the contact to interconnect line 92a is staggered from the contact (not shown) to interconnect line 92b. However, in both cases, the self-alignment of the polysilicon contact 74 with respect to the adjacent gates electrodes 24, the provision of insulating oxide portions between contact 74 and gate electrode 24, and the wide wings 76 on contact 74 permit formation of contacts to substrate 20 from interconnect lines 92 while still maintaining the desired close spacing between gate electrodes 24.

Figure 40A:
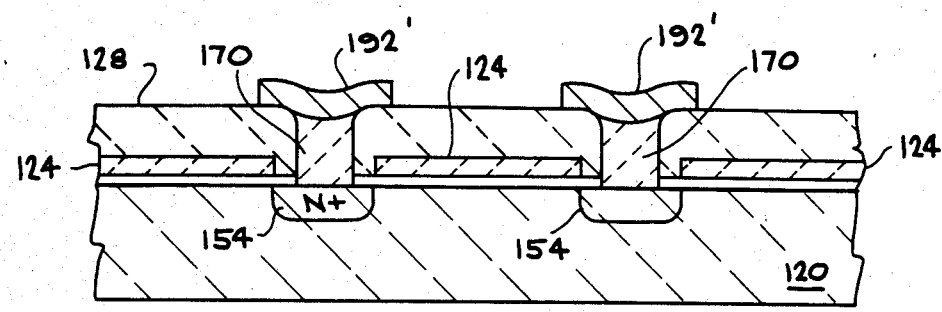
FIGS. 40A-40C are vertical side views in cross-section showing the spacing between contacts utilizing the first embodiment of the invention.
Figure 40B:
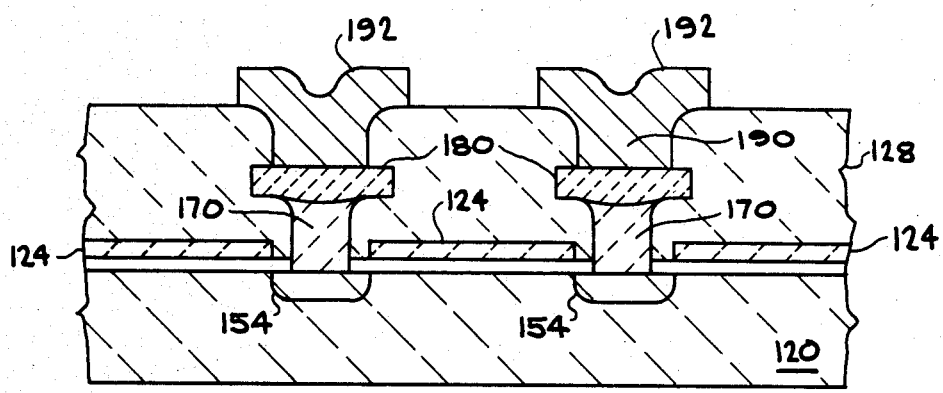
Figure 40C:
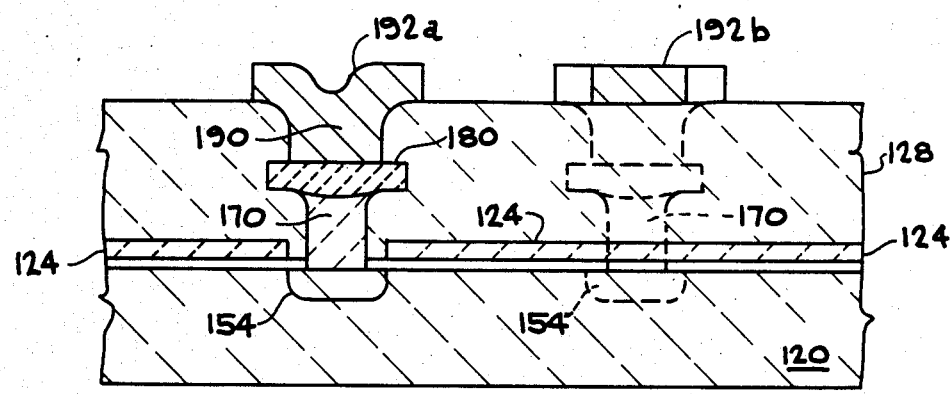
Figure 41:
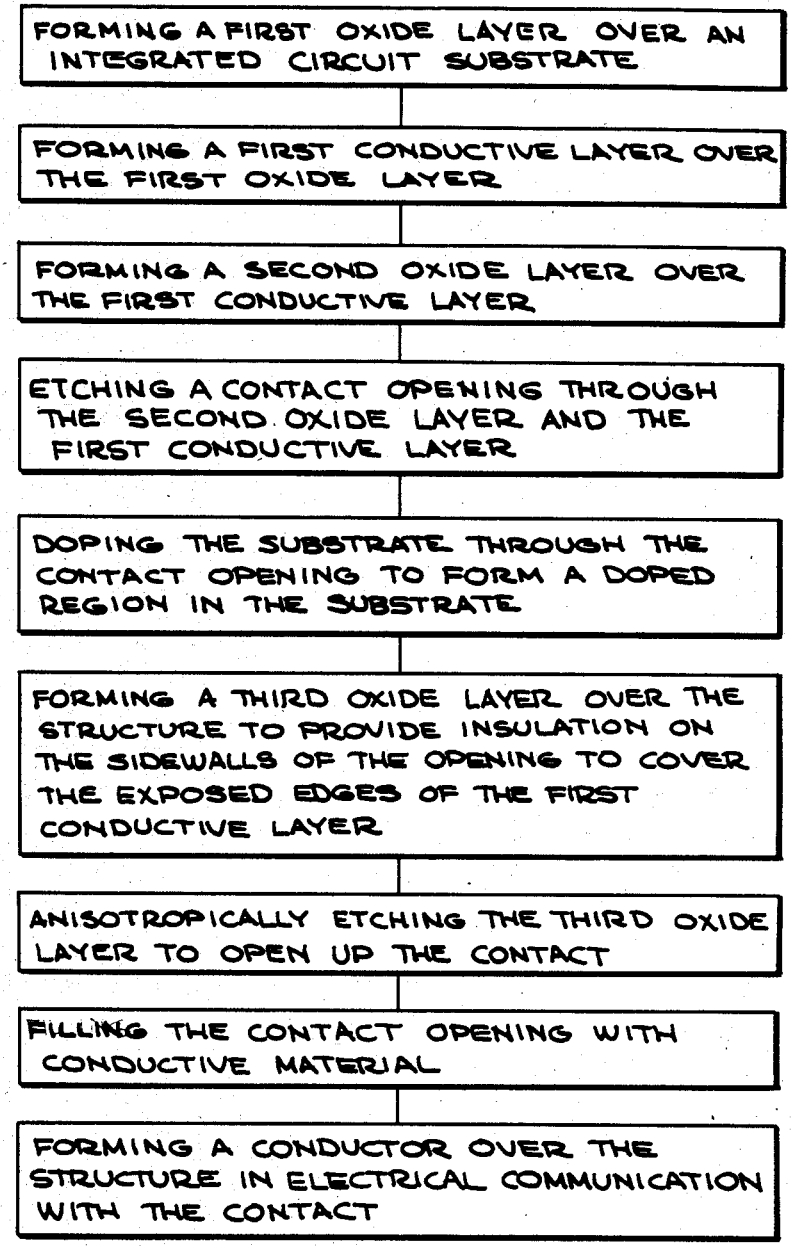
FIG. 41 is a flow sheet illustrating the process of the invention.

The same concepts are illustrated in FIGS. 40A, 40B, and 40C wherein spaced apart interconnect lines 192' (FIG. 40A), 192 (FIG. 40B), and 192a and 192b (FIG. 40C) make contact to the respective N+ regions 154 in substrate 120 while permitting close spacing between adjacent gate electrodes 124. FIG. 40A illustrates direct contact between via or contact 170 and lines 192', while FIG. 40B shows the use of an intermediate pad or strip 180 as previously described with respect to FIG. 33. FIG. 40C illustrates the second embodiment of the invention wherein the contacts to the respective source-drain junctions are staggered as in FIG. 39B.

Thus, the invention provides an improved contact to form an integrated circuit structure which combines the advantages of a self-aligned contact which removes both oxide and portions of an underlying conductive material with a subsequent step of forming oxide sidewalls for the contact to insulate the contact from the edges of the conductive layer which was cut when forming the self-aligned contact whereby adjacent conductive members, e.g., gate electrodes, can be placed close together while still permitting contact to be made to the substrate between the adjacent conductive members.

Having thus described the invention, what is claimed is:

1. A method of making an integrated circuit structure comprising MOS devices connected to word lines and bit lines and having an improved contact construction therein comprising:
   (a) providing an integrated circuit substrate;
   (b) forming a first oxide layer over said substrate comprising a gate oxide portion and one or more field oxide portions.
   (c) forming a first conductive polysilicon layer over said substrate and insulated therefrom by said first oxide layer comprising a word line in electrical communication with one or more gate electrodes over said gate oxide;
   (d) forming a second oxide layer over said first conductive polysilicon layer;
   (e) forming a self-aligned contact opening through said second oxide layer, said underlying first conductive polysilicon layer, and said first oxide layer by an anisotropic reactive ion etching process to control the lateral dimensions of said opening;
   (f) forming a doped region in said substrate through said contact opening to form an active source/drain region for an MOS transistor in said substrate, whereby said doped region in said substrate comprising said active source/drain region will be self-aligned with said contact opening;
   (g) forming a third layer of oxide material over said structure;
   (h) reactive ion etching said third oxide layer to remove said layer except for oxide portions remaining on the sidewalls of said self-aligned contact opening to cover the exposed edges of said first conductive polysilicon layer and to expose at least a central portion of said doped source/drain region in said substrate;
   (i) depositing a second layer of polysilicon conductive material over said structure and in said self-aligned contact opening;
   (j) doping said second polysilicon layer with dopant comprising the same conductivity type as used in said doping step to form said doped region in said substrate beneath said contact;
   (k) diffusing dopant from said doped polysilicon second conductive layer into a portion of said doped source/drain region to form a good contact between said source/drain region in said substrate and said polysilicon material deposited in said opening;
   (l) patterning said second polysilicon conductive layer to provide wing portions of said second polysilicon layer extending laterally of said self-aligned opening and over said first conductive polysilicon word line layer to facilitate subsequent electrical connection thereto through vias from one or more metal layers subsequently applied to said structure;
   (m) forming a fourth oxide layer over said remaining wing portion of said second polysilicon conductive layer;
   (n) forming a contact via through said fourth oxide layer to said winged polysilicon portion; and
   (o) forming a metal bit line over said fourth oxide layer in electrical contact with said winged polysilicon portion;

whereby said contact from said source/drain regions of said MOS structure to said metal bit line may be made using self-alignment techniques which permit close spacing between said bit line contacts to said source/drain regions and said word line wherein said oxide sidewalls on said contact opening and said winged polysilicon contact portions prevent misalignment and possible shorting between said word line and said bit line contact and permit said metal bit line to be positioned on said integrated circuit structure independent of the position of the underlying word line.

2. The method of claim 1 including the step of prepatterning said first conductive polysilicon layer to divide said first conductive layer into parallel word lines over the field oxide portion of said oxide layer.

3. The method of claim 2 including the further steps of providing a conductive strip over said field oxide and applying an oxide layer over said conductive strip prior to formation of said first conductive layer.

4. The method of claim 2 wherein said steps of forming said first oxide layer; said first conductive polysilicon layer, said second oxide layer, and said self-aligned contact opening further comprise patterning said layers with a mask which will extend across said gate oxide to said field oxide to form said self-aligned contact opening and to complete the separation of said first conductive layer into parallel electrodes.

5. The method of claim 3 wherein a plurality of said contacts are formed in a staggered pattern between a plurality of said adjacent parallel word lines.

6. The method of claim 1 including the steps of forming one or more polysilicon strips over said field oxide and applying an intermediate oxide layer over said polysilicon strips prior to formation of said first conductive polysilicon layer; prepatterning said first conductive polysilicon layer to partially divide said first polysilicon layer into parallel word lines portions over said intermediate oxide layer wherein said polysilicon word line strips are parallel to and staggered from said underlying polysilicon strips; said step of etching said second oxide layer, said first polysilicon layer and said first oxide layer to form contact openings to said substrate to form said source/drain regions further includes completing the dividing of said first polysilicon layer into word line strips; and said polysilicon strips on said field oxide will function as etch blocks during said step of forming said contact openings when an oversize etch mask is used to form said contact openings to prevent exposing said substrate in areas where said first polysilicon layer has already been divided into strips to thereby inhibit subsequent formation of undesirable junctions in said substrate during subsequent doping of said substrate to form said source/drain regions.

7. A method of making an integrated circuit structure comprising MOS devices connected to word lines and bit lines and having an improved contact construction therein comprising:

(a) providing an integrated circuit substrate;
(b) forming a first oxide layer over said substrate comprising a gate oxide portion and one or more field oxide portions;
(c) forming one or more polysilicon strips over said field oxide;
(d) applying an intermediate oxide layer over said polysilicon strips;
(e) forming a first conductive polysilicon layer over said substrate and insulated therefrom by said first oxide layer comprising a word line in electrical communciation with one or more gate electrodes over said gate oxide;
(f) prepatterning said first conductive polysilicon layer to partially divide said first polysilicon layer into parallel word lines portions over said intermediate oxide layer wherein said polysilicon word line strips are parallel to and staggered from said underlying polysilicon strips;
(g) forming a second oxide layer over said first conductive polysilicon layer;
(h) forming an contact mask over said second oxide layer which overlaps said polysilicon word line strips;
(i) etching a self-aligned contact opening through said second oxide layer, said underlying first conductive polysilicon layer, and said first oxide layer by an anisotropic reactive ion etching process to control the lateral dimensions of said opening and to complete the dividing of said first polysilicon layer into word line strips, said polysilicon strips on said field oxide acting as etch blocks to prevent exposing said substrate in areas where said first polysilicon layer has already been divided into strips to thereby inhibit subsequent formation of undesirable junctions in said substrate during subsequent doping of said substrate to form source/drain regions;
(j) forming a doped region in said substrate through said contact opening to form an active source/drain region for an MOS transistor in said substrate, whereby said doped region in said substrate comprising said active source/drain region will be self-aligned with said contact opening;
(k) forming a third layer of oxide material over said structure;
(l) reactive ion etching said third oxide layer to remove said layer except for oxide portions remaining on the sidewalls of said self-aligned contact opening to cover the exposed edges of said first conductive polysilicon layer and to expose at least a central portion of said doped source/drain region in said substrate;
(m) depositing a second layer of polysilicon conductive material over said structure and in said self-aligned contact opening;
(n) doping said second polysilicon layer with dopant comprising the same conductivity type as used in said doping step to form said doped region in said substrate beneath said contact;
(o) diffusing dopant from said doped polysilicon second conductive layer into a portion of said doped source/drain region to form a good contact between said source/drain region in said substrate and said polysilicon material deposited in said opening;
(p) patterning said second polysilicon conductive layer to provide wing portions of said second polysilicon layer extending laterally of said self-aligned opening and over said first conductive polysilicon word line layer to facilitate subsequent electrical connection thereto through vias from one or more metal layers subsequently applied to said structure;
(q) forming a fourth oxide layer over said remaining wing portion of said second polysilicon conductive layer;
(r) forming a contact via through said fourth oxide layer to said winged polysilicon portion; and
(s) forming a metal bit line over said fourth oxide layer in electrical contact with said winged polysilicon portion;

whereby said contact from said source/drain regions of said MOS structure to said metal bit line may be made using self-alignment techniques which permit close spacing between said bit line contacts to said source/drain regions and said word line wherein said oxide sidewalls on said contact opening and said winged polysilicon contact portions prevent misalignment and possible shorting between said word line and said bit line contact and permit said metal bit line to be positioned on said integrated circuit structure independent of the position of the underlying word line.

* * * * *